(12) United States Patent
Chang et al.

(10) Patent No.: US 7,510,906 B2
(45) Date of Patent: Mar. 31, 2009

(54) DIAMOND SUBSTRATE AND METHOD FOR FABRICATING THE SAME

(75) Inventors: Hsiao-Kuo Chang, Taipei (TW); Jen-Sheuan Huang, Taipei (TW); Chih-Peng Chen, Taipei (TW); Na-Ling Chen, Taipei (TW); Shih-Pang Wen, Taipei (TW)

(73) Assignee: Kinik Company, Taipei (TW)

( * ) Notice: Subject to any disclaimer, the term of this patent is extended or adjusted under 35 U.S.C. 154(b) by 442 days.

(21) Appl. No.: 11/380,356

(22) Filed: Apr. 26, 2006

(65) Prior Publication Data

US 2006/0243982 A1 Nov. 2, 2006

(30) Foreign Application Priority Data

Apr. 27, 2005 (TW) .............................. 94113548 A (51) Int. Cl.
*H01L 21/00* (2006.01)

(52) U.S. Cl. ..................................... 438/104; 438/503

(58) Field of Classification Search ................. 438/104, 438/503–506
See application file for complete search history.

(56) References Cited

U.S. PATENT DOCUMENTS 7,056,763 B2 * 6/2006 Guttler et al. ............... 438/105
7,132,309 B2 * 11/2006 Sung .......................... 438/105

* cited by examiner

*Primary Examiner*—Richard A. Booth
(74) *Attorney, Agent, or Firm*—Workman Nydegger (57) ABSTRACT

A diamond substrate and a method for fabricating the same are provided wherein a SiC layer is formed on a lower surface of a diamond layer for preventing the diamond layer from being deformed after the process of forming the diamond substrate, and then a semiconductor layer is formed on the diamond layer or directly formed on the surface of the SiC layer. Thereby, the lattice mismatch between the diamond film layer and the semiconductor layer is mitigated by the SiC layer, and the crystalline quality of the semiconductor layer is improved, the fabricating process of the diamond substrate is simplified, and the performance and stability are enhanced.

5 Claims, 11 Drawing Sheets

DIAMOND SUBSTRATE AND METHOD FOR FABRICATING THE SAME

CROSS-REFERENCE TO RELATED APPLICATIONS

This non-provisional application claims priority under 35 U.S.C. § 119(a) on Patent Application No(s). 094113548 filed in Taiwan, R.O.C. on Apr. 27, 2006, the entire contents of which are hereby incorporated by reference.

BACKGROUND OF THE INVENTION

1. Field of Invention

The present invention relates to a diamond substrate and a method for fabricating the same, and more particularly, relates to a diamond substrate having a composite layer structure formed by diamond and SiC and a method for fabricating the same.

2. Related Art

Diamond has excellent properties, such as high light transmittance for light from deep UV light to far infrared light, high surface acoustic wave velocity, high thermal conductivity, high hardness, high radiation-resistance, good chemical inertness, and good insulation property, so that diamond has been widely applied to conventional cutting tools and abrasive tools. Recently, along with the development of the chemical vapor deposition (CVD), the application of diamond has expanded to high-frequency communication devices, heat sink and optical devices of optoelectronics, and diamond semiconductors, etc.

As a photoelectric semiconductor, the light emitting diode (LED) has been developed for over 30 years, and the red, green, and yellow LEDs are well developed. However, the development of blue LEDs was quite slow. Under the development of material and epitaxy, the brightness of blue and white LEDs has been significantly enhanced. At present, a sapphire wafer is mostly used as an epitaxy substrate in the fabricating process. A polycrystalline AlN film and a single-crystalline AlN film are sequentially formed on the sapphire wafer substrate to serve as a buffer layer. And then GaN is formed on the buffer layer, thus obtaining a preferable quality of GaN crystal, and thereby enhancing the luminous efficiency and stability of the LEDs.

The abovementioned conventional process still has many aspects to be improved, and till now many researchers have been devoted to improving the fabricating process. Some of them propose to use the aforementioned diamond with excellent properties to replace the sapphire substrate. However, though the lattice constant between diamond and GaN is matched better than that between the sapphire substrate and GaN, it is still difficult to form a single-crystalline GaN on the surface of a single-crystalline diamond film layer. Besides, due to the thermal stress existing between the diamond layer and the base layer and the internal stress caused by defects in the diamond layer, the diamond layer is easily deformed or fractured. Those mentioned above are problems difficult to be solved.

SUMMARY OF THE INVENTION

In view of the above, the present invention provides a diamond substrate and a method for fabricating the same. The object of the present invention is to form a SiC layer on a diamond layer for preventing the diamond layer from being deformed, wherein the quality of crystal of a semiconductor layer is enhanced, solving the problems existing in the prior art.

In order to achieve the above object, the present invention provides a diamond substrate, which includes a diamond layer, a SiC layer, and a semiconductor layer. The diamond layer is formed on a upper surface of the SiC layer, and the SiC layer prevents the diamond layer from being deformed. And the semiconductor layer is formed on a lower surface of the SiC layer. The SiC layer eliminates the crystal lattice mismatch between the diamond layer and the semiconductor layer, so that the quality of crystal of the semiconductor layer is enhanced.

The diamond layer can be a single-crystalline diamond layer or a polycrystalline diamond layer. The SiC layer can be selected from single-crystalline SiC layer, polycrystalline SiC layer, or amorphous SiC layer. The semiconductor layer can be selected from one of the nitrides such as AlN, BN, AlGaN, and GaN. Moreover, electronic devices, integrated circuits, organic light-emitting diode devices, inorganic light-emitting diode devices, Surface-Acoustic-Wave filter devices, or chemical detection devices can be fabricated on the surface of the semiconductor layer formed by nitride.

In addition, the present invention provides a method for fabricating the diamond substrate, which includes the following steps. First, provide a base layer. Then, form a SiC layer on the base layer. And then form a diamond layer on the SiC layer, wherein the SiC layer prevents the diamond layer from being deformed. Finally, remove the base layer. The SiC layer can eliminate the lattice mismatch between the diamond layer and the semiconductor layer, so that a semiconductor layer of a perfect single-crystalline structure can be formed on the SiC layer.

The present invention provides another diamond substrate, which includes a SiC layer, a diamond layer, and a semiconductor layer. The diamond layer is formed on the SiC layer and the SiC layer prevents the diamond layer from being deformed. And the semiconductor layer is formed on the diamond layer.

The diamond substrate further includes a base layer formed on the lower surface of the diamond layer. The base layer can be a silicon crystal layer. The diamond layer can be a single-crystalline diamond layer or a polycrystalline diamond layer. The SiC can be selected from single-crystalline SiC, polycrystalline SiC, or amorphous SiC. The semiconductor layer can be a P-type semiconductor layer formed by doping the diamond layer with Group III elements or an N-type semiconductor layer formed by doping the diamond layer with Group V elements. Electronic devices, integrated circuits, organic light-emitting diode devices, inorganic light-emitting diode devices, chemical detection devices, or solar cell devices can be fabricated on the surface of the diamond substrate with an N-type or P-type semiconductor layer.

Another method for fabricating the diamond substrate is provided, which includes the following steps. First, provide a base layer. Then, form a SiC layer on the base layer. And then form a diamond layer on the SiC layer, wherein the SiC layer prevents the diamond layer from being deformed. Finally form a semiconductor layer on the diamond layer. Moreover, the method further includes a step of removing the base layer to obtain a diamond substrate without the base layer, thereby facilitating the full application of the superior performance of the diamond substrate in a wider field.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein on a lower surface of for illustration only, and thus are not limitative of the present invention, and wherein.

DETAILED DESCRIPTION OF THE INVENTION

According to the diamond substrate and the method for fabricating the same provided by the present invention, the diamond substrate is disk-shaped with a diameter within a range of 2 to 8 inches.

Figure 1:
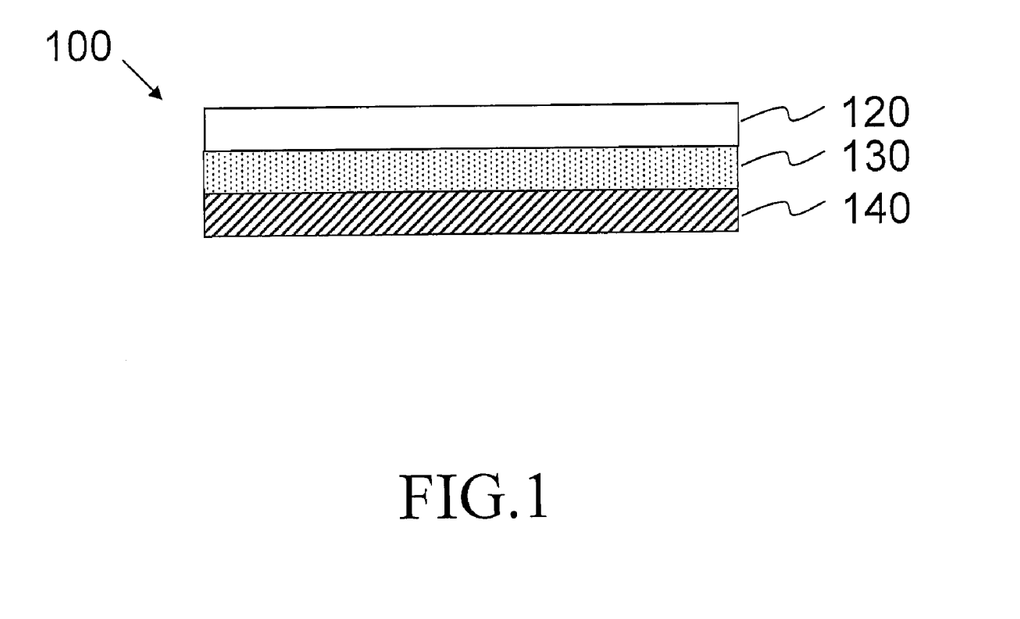
FIG. 1 is a schematic view of the diamond substrate of a first embodiment of the present invention.

Referring to FIG. 1, a diamond substrate 100 of a first embodiment of the present invention includes a diamond layer 120, a SiC layer 130, and a semiconductor layer 140. The diamond layer 120 is formed on an upper surface of the SiC layer 130, and the SiC layer can prevents the diamond layer 120 from being deformed. The semiconductor layer 140 is formed on a lower surface of the SiC layer 130. The SiC layer 130 can mitigate the lattice mismatch between the diamond layer 120 and the semiconductor layer 140, the quality of crystal of a semiconductor layer 140 can be well enhanced.

Figure 2A:
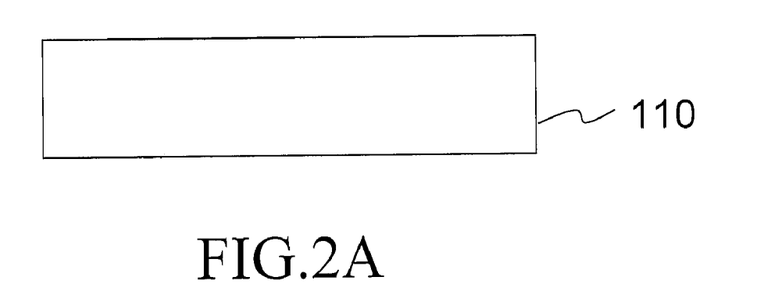
FIGS. 2A to 2E are schematic flow charts of the method for fabricating the diamond substrate of the first embodiment of the present invention.
Figure 2B:
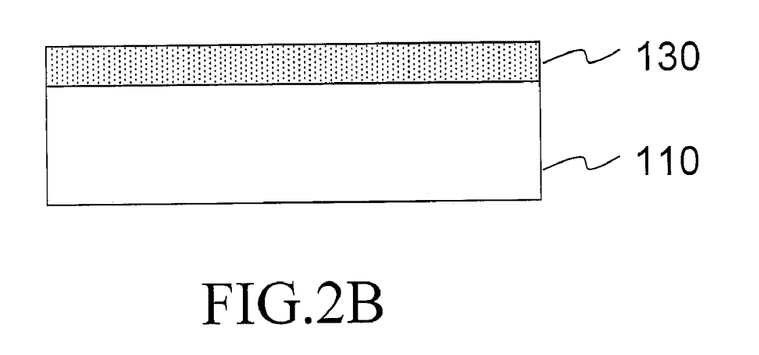
Figure 2C:
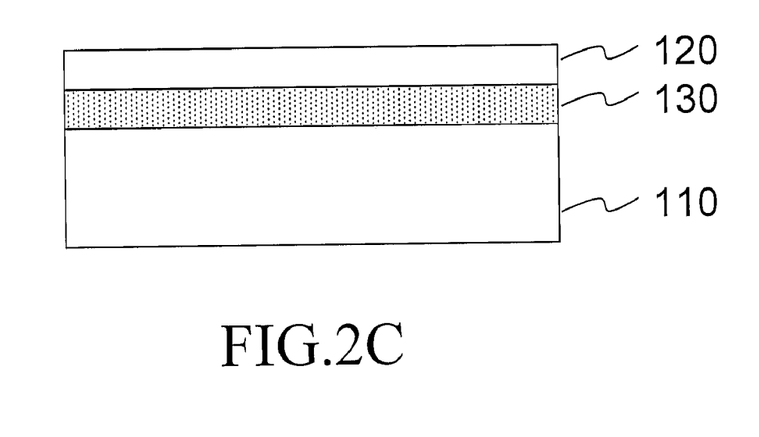
Figure 2D:
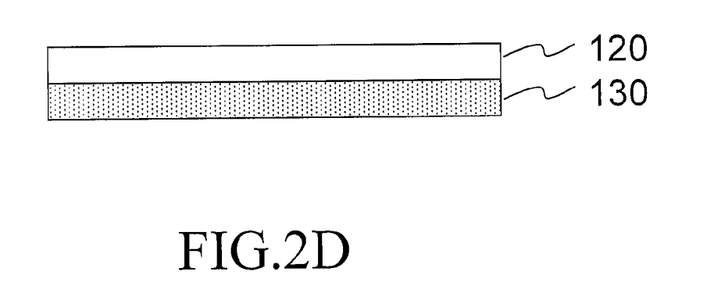
Figure 2E:
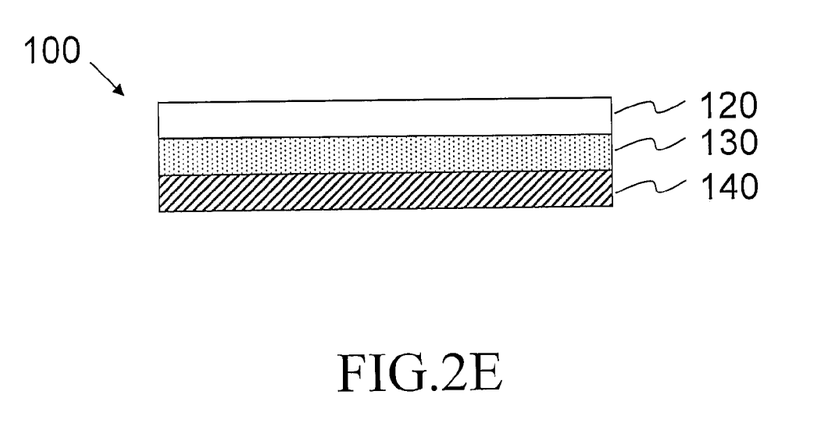

Referring to FIGS. 2A, 2B, 2C, 2D, and 2E, a method for fabricating the diamond substrate of the first embodiment of the present invention is provided. The method includes the following steps. First, provide a base layer 110 (FIG. 2A). Then, form a SiC layer 130 on the base layer 110 (FIG. 2B). And then form a diamond layer 120 on the SiC layer 130 (FIG. 2C). Next, remove the base layer 110 (FIG. 2D). Finally, form a semiconductor layer 140 on a lower surface of the SiC layer 130 (FIG. 2E). Thus, the diamond substrate 100 is formed.

The diamond substrate 100 of the first embodiment can be appropriately shaped by laser cutting, for example, a round shape, quadrate shape, or polygonal shape, and so on. The base layer 110 is a silicon layer. The diamond layer 120 is a single-crystalline diamond layer or a polycrystalline diamond layer. The SiC layer 130 is selected from single-crystalline SiC, polycrystalline SiC, or amorphous SiC. The semiconductor layer 140 is selected from one of nitrides such as AlN, BN, AlGaN, and GaN.

Figure 3:
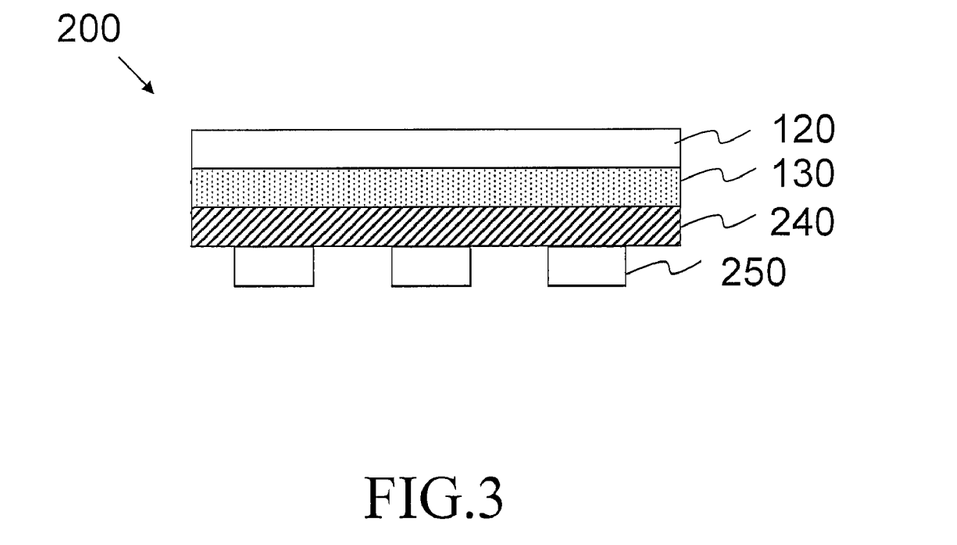
FIG. 3 is a schematic view of the diamond substrate of a second embodiment of the present invention.

Referring to FIG. 3, a diamond substrate 200 of a second embodiment of the present invention is provides, which includes electronic devices 250 disposed on the surface of a nitride semiconductor layer 240. The electronic devices 250 can be integrated circuits, organic light-emitting diode devices, inorganic light-emitting diode devices, Surface-Acoustic-Wave (SAW) filter devices, or chemical detection devices.

Taking the diamond substrate with the GaN semiconductor layer as an illustration, due to characteristics such as high electron mobility and high thermal conductivity, GaN can be applied in blue, green LEDs, next-generation shortwave laser diodes, white-light illumination, and high-power microwave communication devices. Besides, GaN also has piezoelectric property, high surface acoustic wave speed (5800~5900 m/s), and high electromechanical coupling coefficient ($K^2$=4.3), thus GaN is suitable for fabricating Surface-Acoustic-Wave (SAW) filter devices.

Therefore, according to the diamond substrate and the method for fabricating the same provided by the present invention, a GaN semiconductor layer is not required to be formed on a sapphire substrate and a multi-layer AlN is not required to be formed as a buffer layer as required by the prior art. Instead, a single-crystalline GaN can be directly formed on a SiC layer on the diamond layer, so the fabricating process is simplified, thereby achieving the effect of a fast fabricating process and a favorable yield. Moreover, due to the high thermal conductivity, the diamond substrate can prevent electronic devices from being overheated. Particularly, the lattice constant of the diamond substrate in the present invention is close to the lattice constant of the GaN, thus preventing the diamond substrate from being deformed or fractures by residual stress thereof and facilitating GaN being crystallized into a perfect single-crystalline structure, thereby improving the performance and stability of electronic devices.

Figure 4:
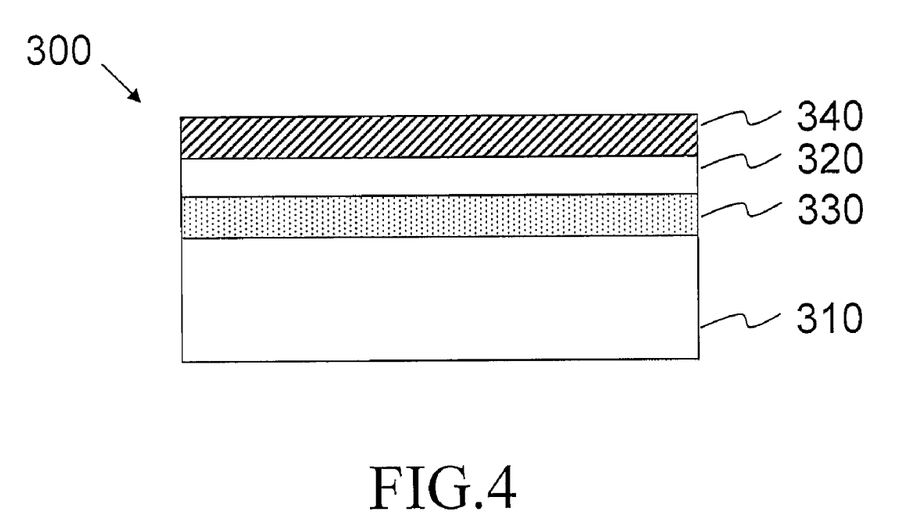
FIG. 4 is a schematic view of the diamond substrate of a third embodiment of the present invention.

Referring to FIG. 4, a diamond substrate 300 is provided by a third embodiment of the present invention. The diamond substrate 300 includes a base layer 310, a diamond layer 320, a SiC layer 330, and a semiconductor layer 340. The SiC layer 330 is formed on an upper surface of the base layer 310. The diamond layer 320 is formed on the upper surface of the SiC layer 330, wherein the SiC layer 330 can prevent the diamond layer 320 from being deformed. The semiconductor layer 340 is formed on the diamond layer 320.

Figure 5A:
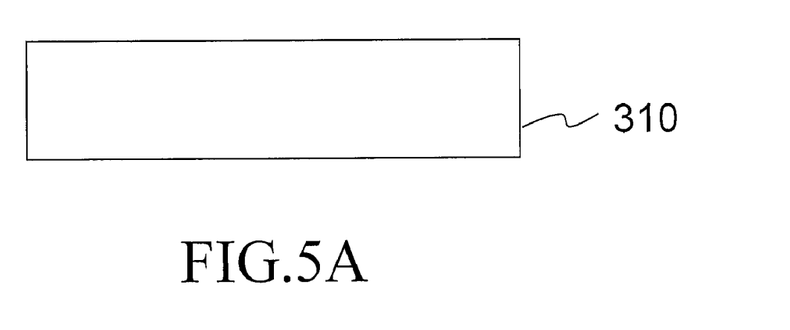
FIGS. 5A to 5D are schematic flow charts of the method for fabricating the diamond substrate of the third embodiment of the present invention.
Figure 5B:
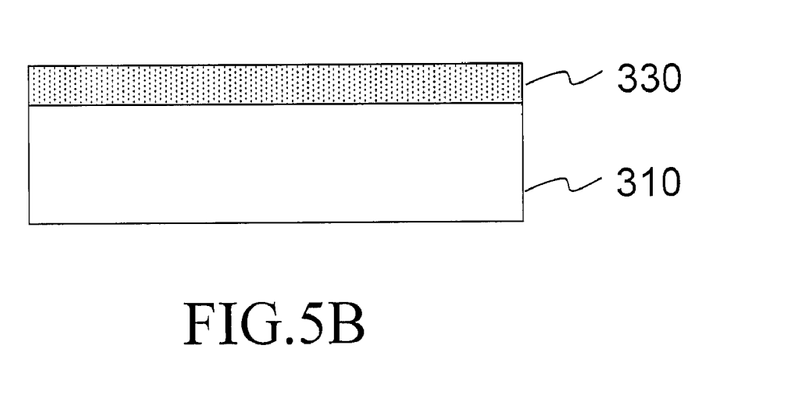
Figure 5C:
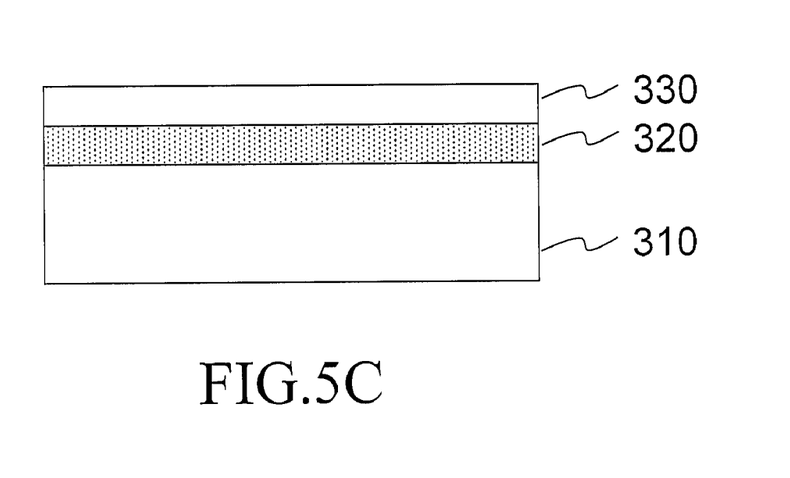
Figure 5D:
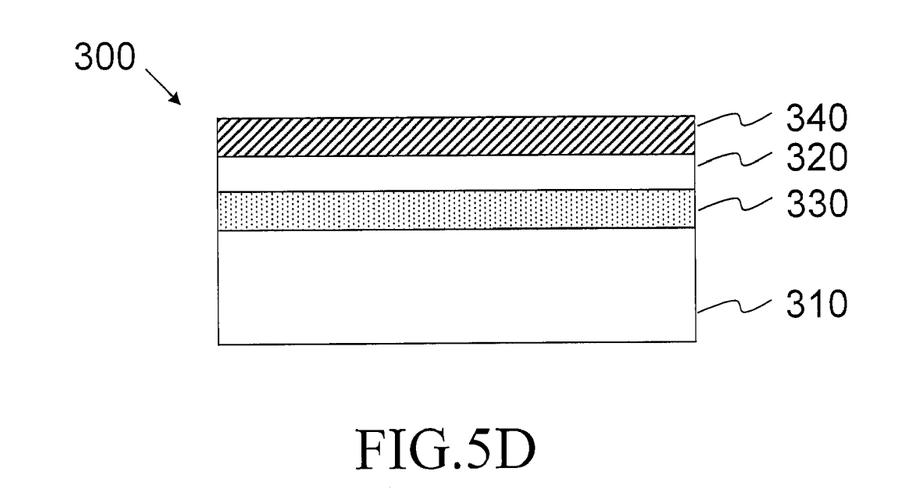

FIGS. 5A, 5B, 5C, and 5D are schematic flow charts of the method for fabricating a diamond substrate according to the third embodiment of the present invention. The method includes the following steps. First, provide a base layer 310 (FIG. 5A). Then, form a SiC layer 330 on the base layer 310 (FIG. 5B). And then form a diamond layer 320 on the SiC layer 330 (FIG. 5C). Finally, form a semiconductor layer 340 on the diamond layer 320 (FIG. 5D). Therefore, the diamond substrate 300 is formed.

The diamond substrate 300 of the present embodiment can be appropriately shaped by laser cutting, for example, a round shape, quadrate shape, or polygonal shape, and so on. The base layer 310 is a silicon layer. The diamond layer 320 is a single-crystalline diamond layer or a polycrystalline diamond layer. The SiC layer 330 can be selected from single-crystalline SiC, polycrystalline SiC, or amorphous SiC.

The semiconductor layer 340 can be a P-type semiconductor layer formed by doping the diamond layer 320 with Group III elements such as Ga, Al, B, and In, or an N-type semiconductor layer formed by doping the diamond layer 320 with Group V elements such as N, P, As, Sb, and Bi.

Furthermore, in the above embodiment, after the SiC layer or the semiconductor layer is formed, a step of removing the substrate is further included to fabricate a diamond substrate without the base layer.

Figure 6:
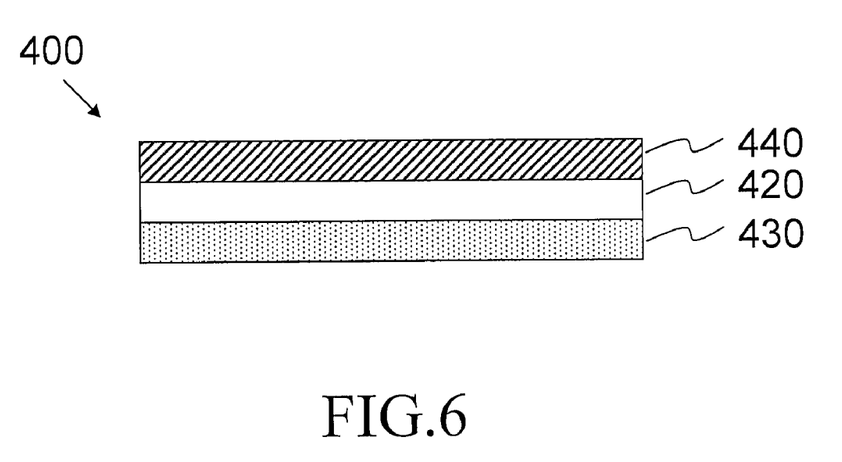
FIG. 6 is a schematic view of the diamond substrate of a fourth embodiment of the present invention.

As shown in FIG. 6, according to the fourth embodiment of the present invention, a diamond substrate 400 includes a diamond layer 420, a SiC layer 430, and a semiconductor layer 440. The diamond layer 420 is formed on the upper surface of the SiC layer 430 and the SiC layer 430 can prevent the diamond layer 420 from being deformed. The semiconductor layer 440 is formed on the upper surface of the diamond layer 420.

Figure 7A:
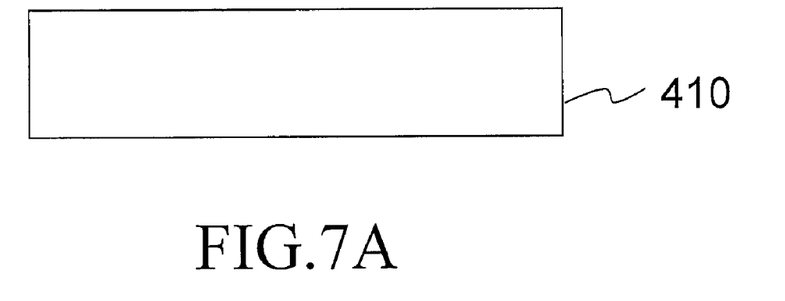
FIGS. 7A to 7E are schematic flow charts of the method for fabricating the diamond substrate of the fourth embodiment of the present invention.
Figure 7B:
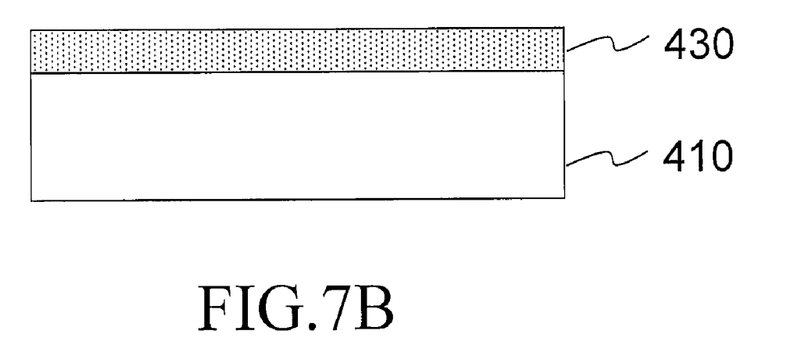
Figure 7C:
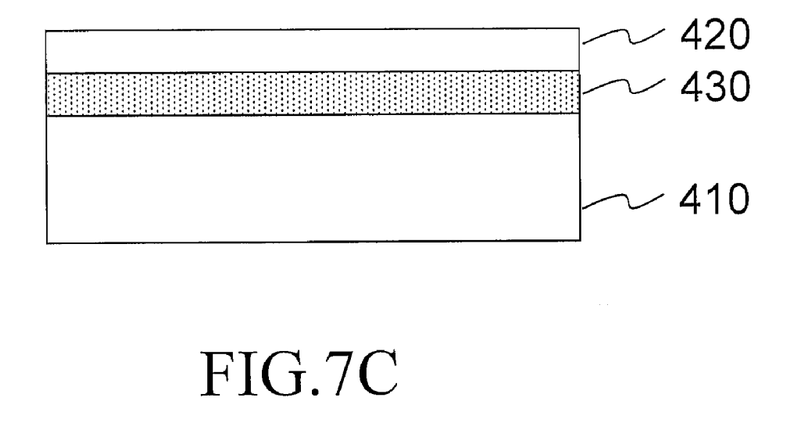
Figure 7D:
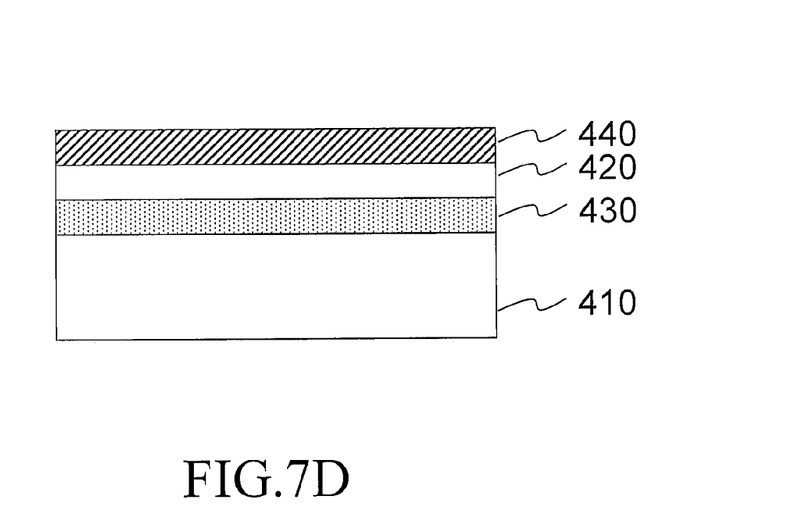
Figure 7E:
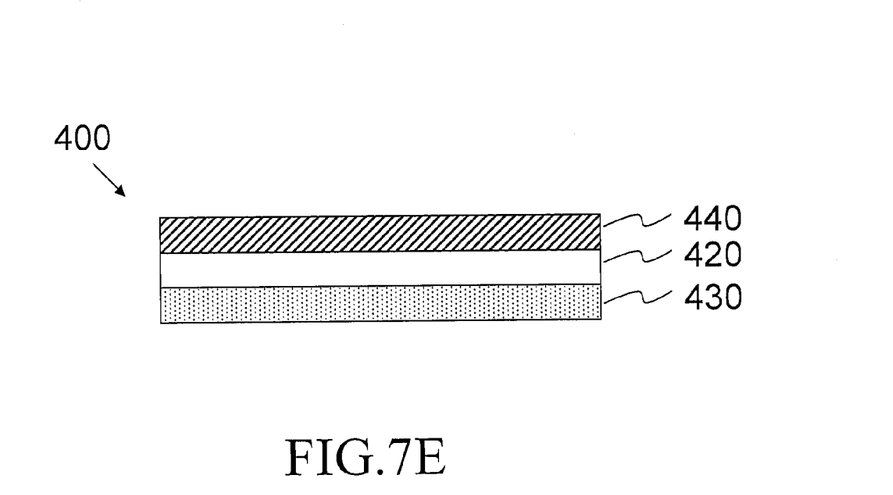

FIGS. 7A, 7B, 7C, 7D, and 7E are schematic flow charts of the method for fabricating a diamond substrate according to the fourth embodiment of the present invention. The method includes the following steps. First, provide a base layer 410 (FIG. 7A). Then, form a SiC layer 430 on the base layer 410 (FIG. 7B). And then form a diamond layer 420 on the SiC layer 430 (FIG. 7C). Next, form a semiconductor layer 440 on the diamond layer 420 (FIG. 7D). Finally, remove the base layer 410 (FIG. 7E). Therefore, the diamond substrate 400 without the base layer is formed.

Moreover, the diamond substrate provided by the present invention can be widely applied in various electronic devices.

Figure 8:
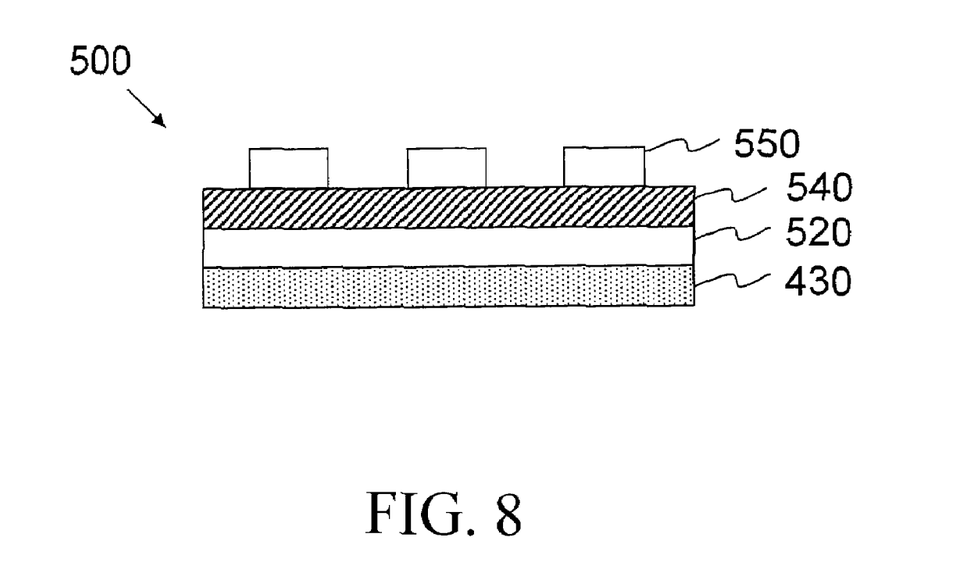
FIG. 8 is a schematic view of the diamond substrate of a fifth embodiment of the present invention.

As shown in FIG. 8, a diamond substrate 500 of a fifth embodiment of the present invention is provided, which includes electronic devices 550 disposed on the surface of a semiconductor layer 540. The semiconductor layer 540 is an N-type or P-type semiconductor layer formed by a doped diamond layer 520. The electronic devices 550 can be integrated circuits, organic light-emitting diode devices, inorganic light-emitting diode devices, chemical detection devices, or solar cell devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating the diamond substrate, comprising:
   providing a base layer;
   forming a SiC layer on the base layer;
   forming a diamond layer on an upper surface of the SiC layer, and the SiC layer preventing the diamond layer form being deformed;
   removing the base layer; and
   forming a semiconductor layer the lower surface of the SiC layer, and the SiC layer eliminating the crystal lattice mismatch between the diamond layer and the semiconductor layer.

2. The method for fabricating the diamond substrate according to claim 1, wherein the base layer is a silicon layer.

3. The method for fabricating the diamond substrate according to claim 1, wherein the diamond layer is selected from the group consisting of a single-crystalline diamond layer and a polycrystalline diamond layer.

4. The method for fabricating the diamond substrate according to claim 1, wherein the SiC is selected from the group consisting of single-crystalline SiC, polycrystalline SiC, and amorphous SiC.

5. The method for fabricating the diamond substrate according to claim 1, wherein the semiconductor layer is formed by material selected from the group consisting of AlN, BN, AlGaN, and GaN.

* * * * *